(12) United States Patent
Okuda

(10) Patent No.: US 7,427,885 B2
(45) Date of Patent: Sep. 23, 2008

(54) SEMICONDUCTOR DEVICE HAVING A POWER SUPPLY CAPACITOR

(75) Inventor: Masaki Okuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/020,169

(22) Filed: Dec. 27, 2004

(65) Prior Publication Data

US 2006/0044038 A1 Mar. 2, 2006

(30) Foreign Application Priority Data

Aug. 30, 2004 (JP) ............... 2004-250632

(51) Int. Cl.
*G06F 1/04* (2006.01)
(52) U.S. Cl. .............. 327/291; 327/299; 327/136; 327/141
(58) Field of Classification Search ............ 327/136, 327/141, 291, 299
See application file for complete search history.

(56) References Cited

U.S. PATENT DOCUMENTS 5,043,597 A * 8/1991 Furuyama et al. .......... 327/534
5,498,988 A * 3/1996 Reyes et al. ................ 327/199
5,892,374 A * 4/1999 Fiedler ..................... 327/65
6,166,585 A * 12/2000 Bazzani .................... 327/536
6,181,633 B1 * 1/2001 Shimakawa et al. ..... 365/230.03
6,384,674 B2 * 5/2002 Tanizaki et al. ........... 327/544
6,771,112 B1 * 8/2004 Ishikawa et al. .......... 327/427
6,791,127 B2 * 9/2004 Nunokawa ................ 257/203

FOREIGN PATENT DOCUMENTS

JP        03120743 A    5/1991

* cited by examiner

*Primary Examiner*—N. Drew Richards
*Assistant Examiner*—An T. Luu
(74) *Attorney, Agent, or Firm*—Arent Fox LLP

(57) ABSTRACT

In order to prevent a signal of a signal wiring from receiving a bad influence due to a power supply capacitor, provided is a semiconductor including a high reference potential terminal and a low reference potential terminal composing power supply voltage terminals; a first MOS capacitor in which a gate of a p-channel MOS field effect transistor is connected to the low reference potential terminal, and a source and a drain are connected to the high reference potential terminal; and a first signal wiring connected to the gate via a parasitic capacitor and a signal in the low reference potential is supplied at the time of starting the power supply.

18 Claims, 10 Drawing Sheets

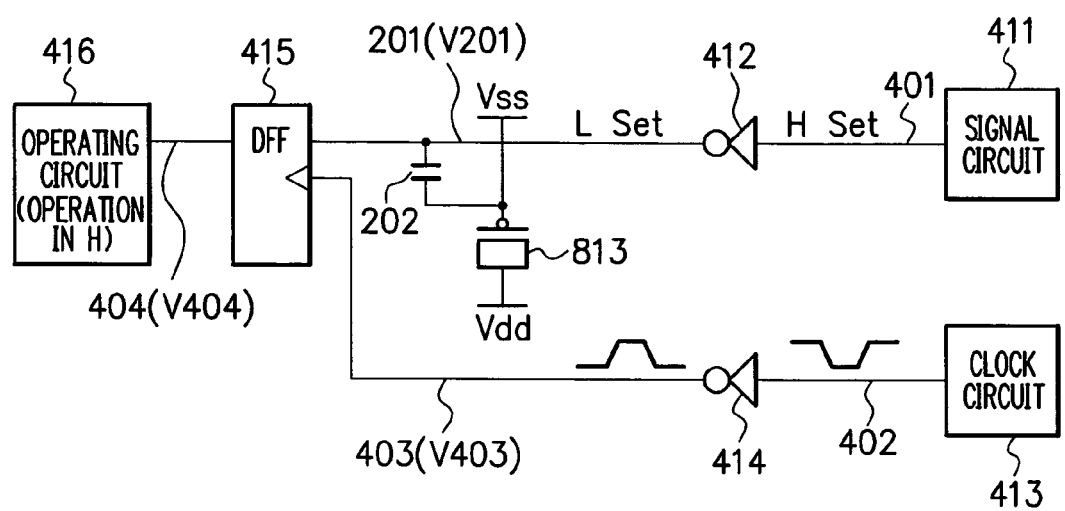
F I G. 7

F I G. 9
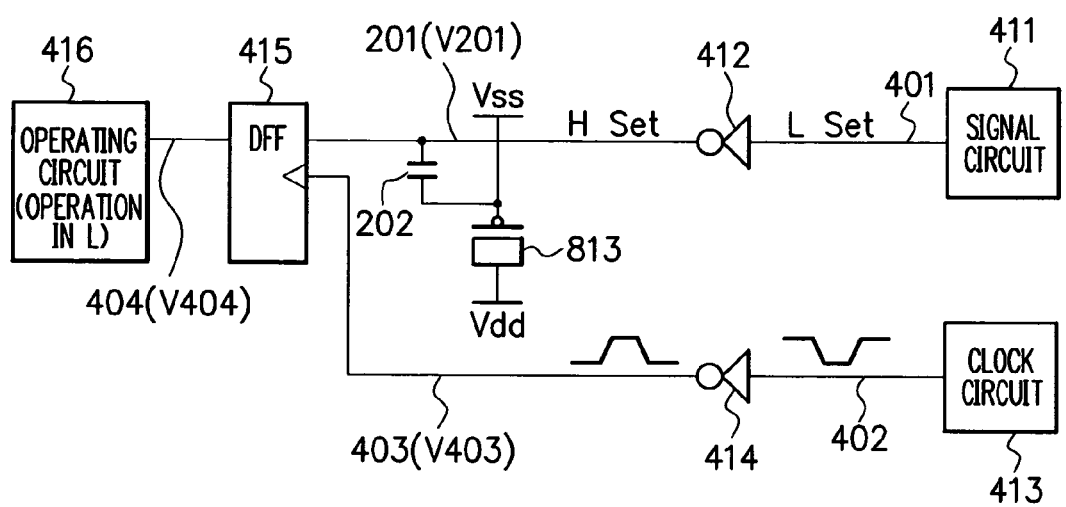

SEMICONDUCTOR DEVICE HAVING A POWER SUPPLY CAPACITOR

CROSS-REFERENCE TO RELATED APPLICATIONS

This application is based upon and claims the benefit of priority from the prior Japanese Patent Application No. 2004-250632, filed on Aug. 30, 2004, the entire contents of which are incorporated herein by reference.

BACKGROUND OF THE INVENTION

1. Field of the Invention

The present invention relates to a semiconductor device, in particular, having a power supply capacitor.

2. Description of the Related Art

A semiconductor tip has external terminals for power supply potential Vdd and for reference potential Vss. By connecting a condenser (capacitor) for individual parts on an exterior substrate of the semiconductor tip between these two exterior terminals as a bypass condenser, stabilization of power supply voltage is realized. In recent progress of micronization in a semiconductor (semiconductor tip), a demand has come out to reduce the number of parts outside of the semiconductor by providing the bypass condenser in the semiconductor device.

A semiconductor in which power supply wirings are disposed between signal wirings is disclosed in a Patent Document 1 below.

Patent Document 1

Japanese Patent Application Laid-open No. Hei 3-120743

SUMMARY OF THE INVENTION

An object of the present invention is to prevent a signal of a signal wiring from receiving a bad influence due to a power supply capacitor.

According to an aspect of the present invention, provided is a semiconductor comprising: a high reference potential terminal and a low reference potential terminal composing power supply voltage terminals; a first MOS capacitor in which a gate of a p-channel MOS field effect transistor is connected to the low reference potential terminal, and a source and a drain are connected to the high reference potential terminal; and a first signal wiring connected to said gate via a parasitic capacitor and a signal in the low reference potential is supplied at the time of starting the power supply.

BRIEF DESCRIPTION OF THE DRAWINGS

FIG. 7 is a circuit diagram showing an example of a semiconductor device using a bypass MOS condenser and signal wiring according to a first embodiment of the present invention;

FIG. 9 is a circuit diagram showing another example of a semiconductor device using a p-channel MOS capacitor and signal wiring;

DETAILED DESCRIPTION OF THE PREFERRED EMBODIMENTS

First Embodiment

A power supply stabilizing capacitor (a bypass condenser) is connected to a power supply of a semiconductor device to supply stable voltage for a power supply, reducing the amount of drop in voltage of the power supply. If the bypass condenser is provided outside of a semiconductor device, the number of external parts is increased which makes the cost expensive. Therefore, by providing a bypass condenser within a semiconductor device, the number of exterior parts is reduced so that an inexpensive substrate module can be produced.

The bypass condenser is configured as a MOS capacitor using a MOS (metal-oxide semiconductor) field effect transistor equivalent to a MOS field effect transistor used as an internal logic circuit of a semiconductor device. By constituting a bypass condenser with a MOS capacitor, it becomes lower in price than producing with expensive materials and increases processes of semiconductor production. Hereinafter, a MOS field effect transistor is referred to only as a transistor.

Figure 1:
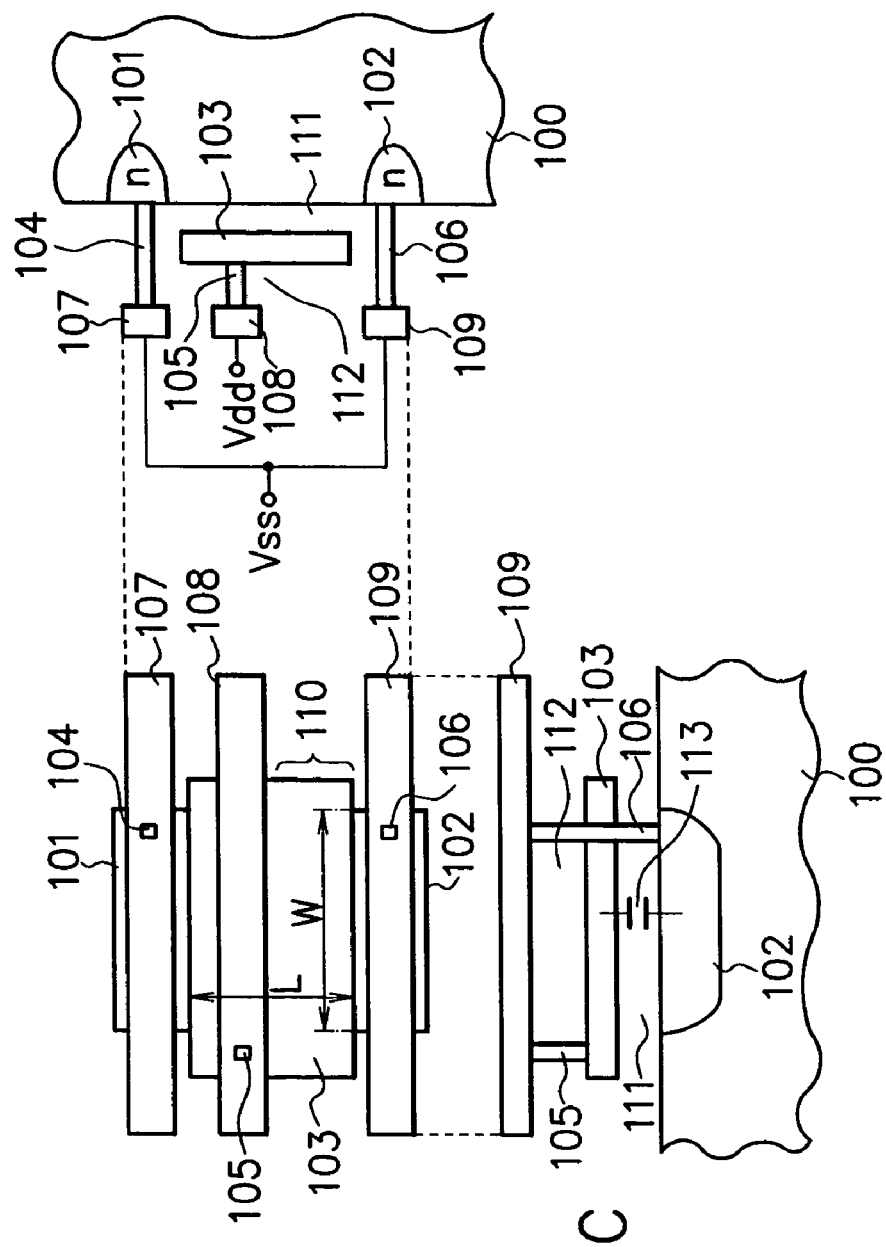
FIGS. 1A to 1C are views showing a configuration example of a semiconductor device for a n-channel MOS capacitor.

FIGS. 1A to 1C are views showing a configuration example of a semiconductor device for an n-channel MOS capacitor. The n-channel MOS capacitor is configured using an n-channel transistor. FIG. 1A is a front view of the semiconductor device, FIG. 1B is a sectional view of the semiconductor device in FIG. 1A seen from the right, and FIG. 1C is a sectional view of the semiconductor device in FIG. 1A seen from the bottom.

A p-type substrate 100 is, for instance, a silicon substrate. A source 101 is an n-type diffusing region provided in the p-type substrate 100. A drain 102 is an n-type diffusing region provided in the p-type substrate 100. A channel region is provided on the surface of the substrate 100 between the source 101 and the drain 102. Above the channel region, a gate 103 is provided via a gate insulating film 111. The gate insulating film 111 is, for instance, a silicon oxide film. The gate 103 is formed with, for instance, polysilicon. On the gate 103, a wiring layer (including wiring for power supply 107, 108, and 109) is provided via an insulating film 112. The wiring for power supply 107 is a source wiring and connected to the source 101 via a contact 104. The wiring for power supply 108 is a gate wiring and electrically connected to the gate 103 via a contact 105. The wiring for power supply 109 is a drain wiring and electrically connected to the drain 102 via a contact 106.

Terminals for the high reference potential Vdd and the low reference potential Vss form power supply voltage. For instance, the high reference potential Vdd is 5 V or 3.3 V, and the low reference potential Vss is 0 V (ground). The source wiring 107 and the drain wiring 109 are connected to the terminal of the low reference potential Vss, and the gate wiring 108 is connected to the terminal of the high reference potential Vdd. In other words, the low reference potential Vss is supplied to the source 101 and the drain 102, and the high reference potential Vdd is supplied to the gate 103. Thereby, a channel is formed between the source 101 and the drain 102 to form a MOS capacitor 113.

The MOS capacitor 113 is formed between the gate 103 and the n-type regions 101, 102. By setting the voltage at the gate 103 to the power supply voltage Vdd which is equal to or greater than the transistor threshold voltage Vth taking the potential of the n-type regions 101 and 102, a capacitor is formed.

As described above, in the n-channel MOS capacitor 113, by applying the high reference potential Vdd to the gate 103, and the low reference potential Vss to the source 101 and the drain 102, the channel is formed in the channel region, and a MOS capacitor is formed, in which the gate insulating film 111 functions as a dielectric material, and the gate 103, and the n-type diffusing regions 101, 102 function as electrodes. The capacity value C is given by equation (1).

$$C = \epsilon \times S / t \quad (1)$$

Here, $\epsilon$ denotes permittivity of the gate insulating film 111 and expressed by relative permittivity of the gate insulating film 111×vacuum permittivity. S denotes a gate area, and expressed by channel width W×channel length L. t denotes a thickness of the gate insulating film 111.

In order to obtain a stable power supply voltage, the capacitor value of the MOS capacitor 113 must be about 10000 [pf] though depending on a consuming current. When applying this to the equation (1), it is as follows. Here, t is assumed to 10 [nm] and $\epsilon$ is $34 \times 10^{-12}$ [F/m]

$$S = C \times t / \varepsilon$$
$$= 10000 \; [pF] \times 10 \; [nm] / (34 \times 10^{-12} \; [F/m])$$
$$\doteq 3 \; [mm^2]$$

For instance, since the size of DRAM (dynamic random access memory) having 128 Mbit is now about 30 mm², the area of the gate S (3 mm²) corresponds to about 10% in area of the DRAM, which means it requires a big area. It is possible to realize the size of the gate area S=3 [mm²] with one piece of transistor, but it is realistically preferable to realize the gate area S=3 [mm²] by connecting a lot of transistors in parallel.

Since the gate area S requires a large area, it is preferable to effectively use a space area 110 in the wiring layer above the gate 103. By disposing signal wiring in the space area 110, and by disposing the MOS capacitor 113 and the signal area in the same area, the overall area of the semiconductor device can be reduced.

Figure 2:
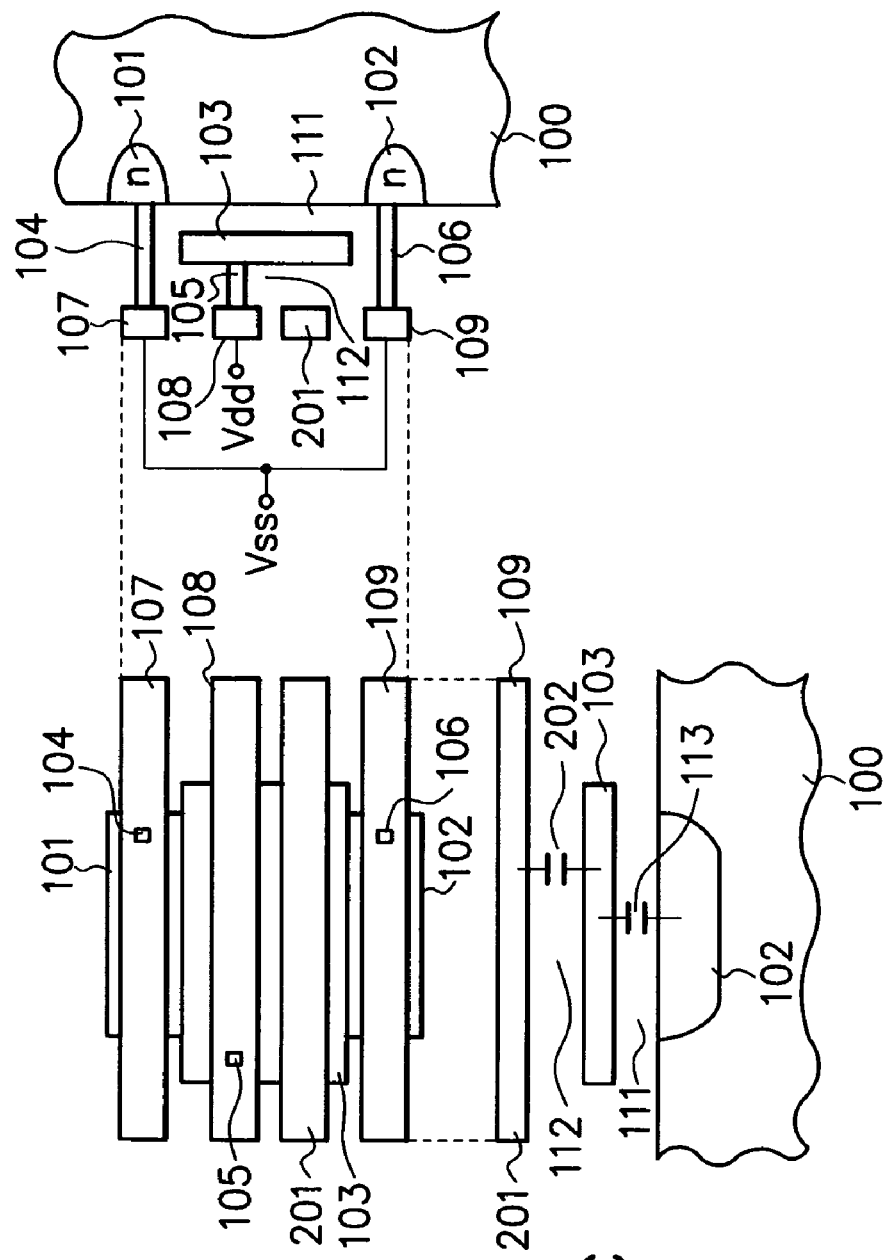
FIGS. 2A to 2C are views showing a configuration example of a semiconductor device in which signal wiring is provided in a space area of the n-channel MOS capacitor.

FIGS. 2A to 2C are views showing a configuration example of a semiconductor device in which signal wiring 201 is provided in the space area 110 of the n-channel MOS capacitor 113 in FIGS. 1A to 1C. FIG. 2A is a front view of the semiconductor device, FIG. 2B is a sectional view of the semiconductor device in FIG. 2A seen from the right, and FIG. 2C is a sectional view of the semiconductor device in FIG. 2A seen from the bottom.

The signal wiring 201 is connected to the gate 103 via the insulating film 112 at an upper portion of the gate 103. Since the signal wiring 201 extends over a long distance, a large parasitic capacitor 202 is added between the gate 103 and the signal wiring 201. In other words, the signal wiring 201 is connected to the gate 103 via the parasitic capacitor 202. The wiring for power supply 107 to 109 and the signal wiring 201 are provided in the wiring layer. In the area of the MOS capacitor 113, by providing the signal wiring 201 in the space area of the wiring layer, the area of the semiconductor device can be effectively used. The signal wiring 201 can be used as a signal wiring for other circuits in semiconductor devices other than the MOS capacitor 113.

Figure 4:
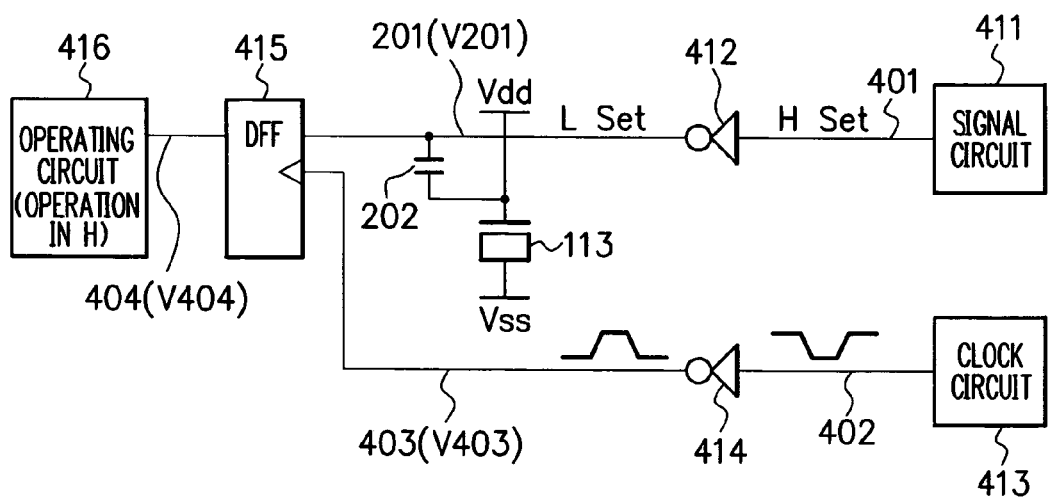
FIG. 4 is a circuit diagram showing an example of a semiconductor device using a bypass MOS condenser and a signal wiring.

For instance, as shown in FIG. 4, in the above-described n-channel MOS capacitor 113, the gate is connected to the terminal of the high reference potential Vdd, and the source and the drain are connected to the terminal of the low reference potential Vss. The signal wiring 201 is connected to the gate 103 of the MOS capacitor 113 via the parasitic capacitor 202. In short, the signal wiring 201 is connected to the terminal of the high reference potential Vdd via the parasitic capacitor 202.

Figure 3:
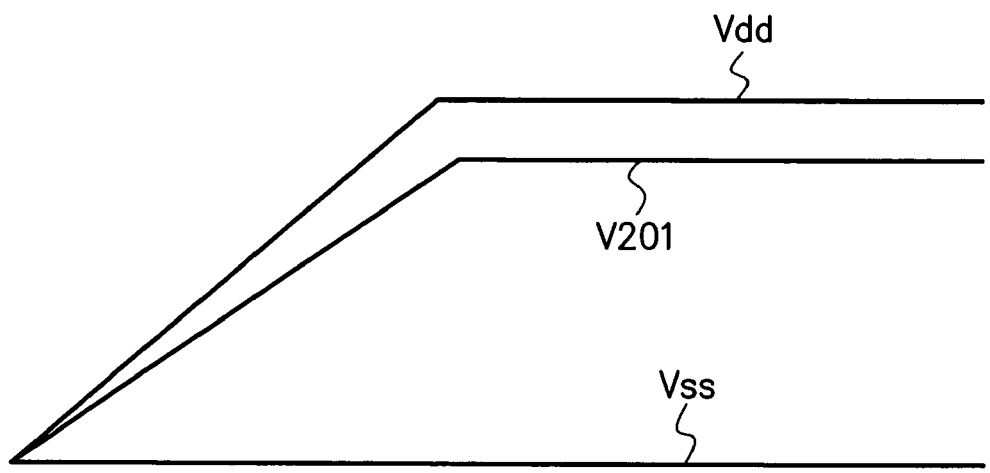
FIG. 3 is a wave-form diagram showing voltage of the signal wiring at the time of starting the power supply.

FIG. 3 is a wave-form diagram showing voltage V201 of the signal wiring 201 at the time of starting the power supply. Here, for the sake of simplicity, explanation will be made on the assumption that the wiring signal 201 is in a floating. The horizontal axis denotes time. On starting the power supply, the high reference potential Vdd rises gradually from 0 V, and then settles down at a fixed potential. The low reference potential Vss maintains 0 V. Since the signal wiring 201 is in floating state, no voltage is supplied from the first. However, since the signal wiring 201 is connected (capacitive coupling) to the high reference potential Vdd via the parasitic capacitor 202, the voltage V201 rises following to the high reference voltage Vdd and settles to a fixed value. In other words, on starting the power supply, the voltage V201 of the signal wiring 201 rises without intention. This phenomenon leads to cause a malfunction of a circuit using the signal wiring 201. The circuit example is shown in FIG. 4.

FIG. 4 is a circuit diagram showing an example of a semiconductor device using a bypass MOS condenser 113 and the signal wiring 201. The semiconductor device can perform, for instance, a writing operation and a reading operation of a memory.

A signal circuit 411 supplies a signal in a high reference potential (high level) Vss to the wiring 401 in order to supply a signal in a low reference potential (low level) Vss to the signal wiring 201 at the time of starting the power supply. A driver 412 outputs the signal of the wiring 401 to the signal wiring 201 in logical inverse amplification.

A clock circuit 413 outputs a clock signal to the wiring 402 to supply a clock signal to a flip-flop 415. A driver 414 outputs a signal of the wiring 402 to a wiring 403 in logical inverse amplification.

The D-type flip-flop 415 outputs to an operating circuit 416 via wiring 404 in synchronization with rising of a clock signal of the wiring 403 while maintaining the signaling state of the signal wiring 201. Even when the clock signal falls thereafter, the flip-flop 415 outputs while maintaining the state. The operating circuit 416 operates when the wiring 404 becomes the high reference potential Vdd, a function in the semiconductor device such as starting of computation or the like is served. In short, the operating circuit 416 can be operatable when the high reference potential Vdd is supplied to the signal wiring 201.

Figure 5:
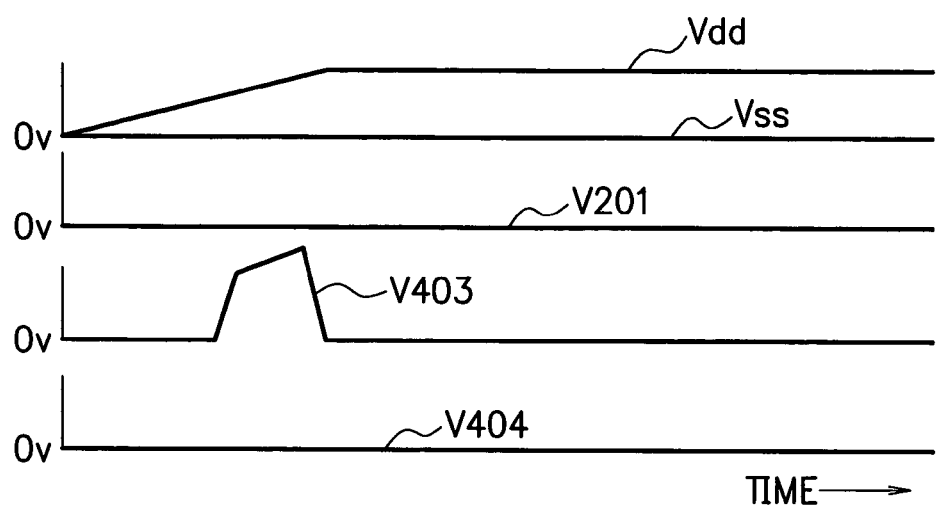
FIG. 5 is a timing chart showing an example of operation at the time of starting the power supply of an ideal semiconductor device when no parasitic capacitor 202 in FIG. 4 is in existence.

FIG. 5 is a timing chart showing an example of operation at the time of starting the power supply of an ideal semiconductor device when no parasitic capacitor 202 in FIG. 4 is in existence. The high reference potential Vdd and the low reference potential Vss are the same as the above-described explanation for FIG. 3. On starting the power supply, the high reference potential Vdd rises gradually from 0 V, and then settles down at a fixed potential. The low reference potential Vss maintains 0 V. The signal circuit 411 outputs the high reference potential Vdd to the wiring 401 at the time of starting the power supply, the driver 412 logically inverses an output signal of the high reference potential Vdd to output to the signal wiring 201. Voltage V201 of the signal wiring 201 maintains the low reference potential Vss (0 V). Voltage V403 of the wiring 403 is a voltage of the clock signal corresponding to the clock circuit 413. The flip-flop 415 synchronizes with rising of the voltage V403 and outputs voltage V404 to the wiring 404 while keeping the voltage V201. Since the voltage V201 is the low reference potential Vss at rising time of the voltage V403, the voltage V404 maintains the low reference potential Vss. Since the voltage V404 is the low reference potential Vss, the operating circuit 416 stops operation. During the power supply starting period, the high reference potential Vdd is unstable from the time that it rises untill it settles down to a fixed value when the power supply starts. During the power supply starting period, the writing operation, the reading operation, and the like of the operating circuit 416 can not be stably performed. Accordingly, as described above, at the time of starting the power supply, the operation of the operating circuit 416 can be stopped in such a manner that the signal circuit 411 makes the voltage V201 equal to the low reference potential Vss. Thereby, the unstable operation of the operating circuit 416 can be prevented during the power supply starting period.

Operation after starting the power supply will be explained next. The signal circuit 411 outputs the low reference potential Vss to the wiring 401 as a write command, a read command, or the like when a writing or reading operation or the like is required. The driver 412 outputs the voltage V202 of the high reference potential Vdd by logically inversing the output signal.

The flip-flop 415 synchronizes with rising of the voltage V403, and outputs the voltage V404 while keeping the state of the voltage V202. Since the voltage V404 becomes the high reference voltage Vdd, the operating circuit 416 can perform writing operation, reading operation, and the like.

Figure 6:
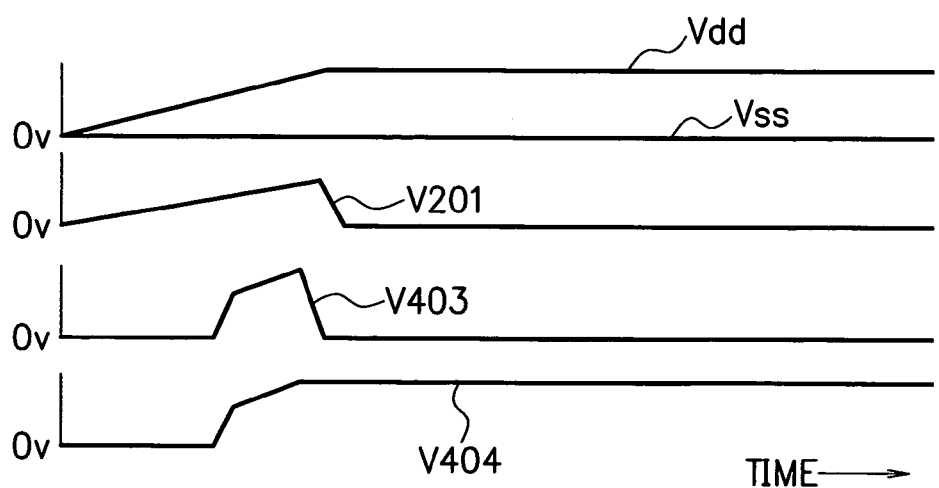
FIG. 6 is a timing chart showing an example of operation at the time of starting the power supply of the semiconductor device when the parasitic capacitor 202 in FIG. 4 is in existence.

FIG. 6 is a timing chart showing an example of operation at the time of starting the power supply of the semiconductor device when the parasitic capacitor 202 in FIG. 4 is in existence. The same explanation as for FIG. 5 can be given to the high reference potential Vdd and the low reference potential Vss. Since the high reference potential Vdd does not reach a fixed potential at the time of starting the power supply, the output capacity of the driver 412 is insufficient. Accordingly, similar to the above-described explanation for FIG. 3, since the signal wiring 201 is connected to the high reference potential Vdd via the parasitic capacitor 202, the voltage V201 rises following to the high reference potential Vdd. When the high reference potential Vdd rises to a fixed value, the output capacity of the driver 412 is sufficient, and the voltage V201 becomes the low reference potential Vss. Explanation of a clock voltage V403 of the wiring 403 is the same as the above-described explanation for FIG. 5.

The flip-flop 415 synchronizes with rising of the voltage V403 and outputs the voltage V404 to the wiring 404 while keeping the voltage V201. Since the voltage V201 is in a high level at the time of rising of the voltage V403, the voltage V404 becomes the high reference potential Vdd. Since the voltage V404 of the operating circuit 416 is the high reference potential Vdd, it operates even at the time of starting the power supply. However, during the power supply starting period, since the high reference potential Vdd does not reach a fixed value, the operating circuit cannot operate stably, which causes a problem of leading to an erroneous operation.

As described above, when the signal wiring 201 is provided in order to effectively utilize the space area 110 of the bypass MOS condenser 113, a semiconductor device leads to an erroneous operation at the time of starting the power supply due to the effect of the parasitic capacitor 202. A semiconductor device to solve the problem is shown in FIG. 7.

FIG. 7 is a circuit diagram showing an example of a semiconductor device using a bypass MOS condenser and signal wiring according to the first embodiment of the present invention. The circuit in FIG. 7 differs from the circuit in FIG. 4 in that a p-channel MOS capacitor 813 is provided instead of the n-channel MOS capacitor 113. The different points will be explained below. In the p-channel MOS capacitor 813, the gate is connected to the low reference potential Vss, and the source and the drain are connected to the high reference potential Vdd. The p-channel MOS capacitor 813 is a capacitor having the same characteristics as those of the n-channel MOS capacitor 113, and can similarly maintain a stable power supply voltage with the same size.

Figures 8A, 8B, 8C:
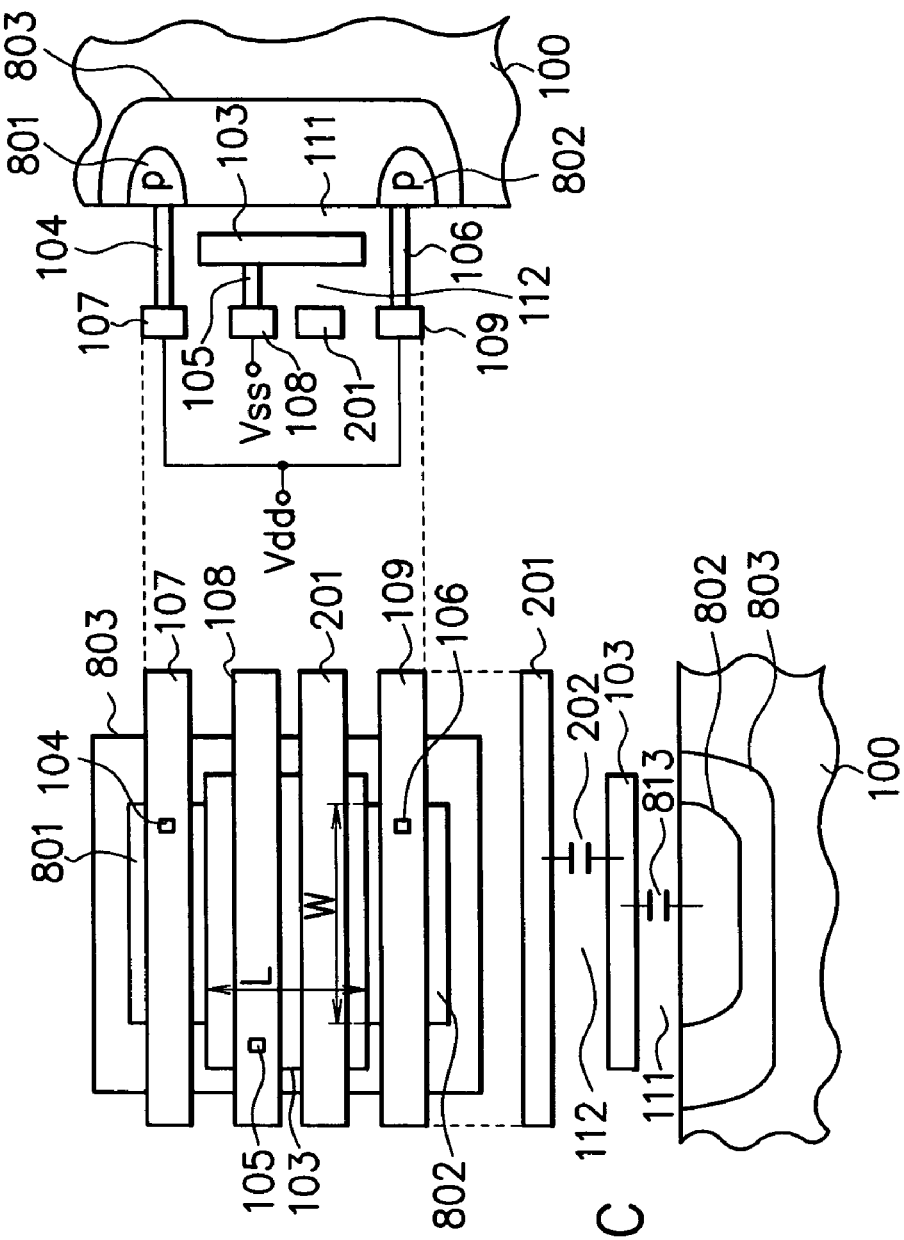
FIGS. 8A to 8C are views showing an example of configuration of a semiconductor device using p-channel MOS capacitor and signal wiring.

FIGS. 8A to 8C are views showing an example of configuration of a semiconductor device using the power supply bypass MOS capacitor 813 and the signal wiring 201 in FIG. 7. FIG. 8A is a front view of the semiconductor device, FIG. 8B is a sectional view of the semiconductor device in FIG. 8A seen from the right, and FIG. 8C is a sectional view of the semiconductor device seen from the bottom. The power supply bypass MOS capacitor 813 is a p-channel MOS capacitor using a p-channel transistor.

The semiconductor device in FIGS. 8A to 8C will be explained for different points from the semiconductor device in FIGS. 2A to 2C. An n-type diffusion region 803 is provided in a p-type substrate 100. In the n-type diffusion region 803, p-type diffusion regions 801 and 802 are provided. The p-type diffusion region 801 is a source and the p-type diffusion region 802 is a drain. On the surface of the p-type substrate 100, a channel region is formed between the source 801 and the drain 802. The source 801 is connected to power supply wiring 107 via the contact 104. The drain 802 is connected to the power supply wiring 109 via the contact 106. A terminal of the high reference potential Vdd are connected to the source 801 and the drain 802 via the power supply wiring 107 and 109. A terminal of the low reference potential Vss is connected to the gate 103 via the power supply wiring 108. Thereby, a channel is formed between the source 801 and the drain 802, and the p-channel MOS capacitor 813 is formed. The p-channel MOS capacitor 813 is formed between the gate 103 and the p-type rigions 801 and 802. The signal wiring 201 is connected to the gate 103 via the parasitic capacitor 202.

The operation of the circuit in FIG. 7 will be explained with reference to FIG. 5. Explanation of the high reference potential Vdd and the low reference potential Vss is the same as the above explanation for FIG. 5. A wiring circuit 411 outputs the high reference potential Vdd to the wiring 401 at the time of starting the power supply, and the driver 412 logically inverses an output signal of the high reference potential Vdd and outputs to the signal wiring 201. Since the signal wiring 201 is connected to the low reference potential Vss via the parasitic capacitor 202, and the voltage V201 of the signal wiring 201 maintains the low reference potential Vss (0 V). The voltage V403 of the wiring 403 is a voltage of a clock signal corresponding to the clock circuit 413. The flip-flop 415 synchronizes with rising of the voltage V403 and outputs the voltage V404 to the wiring 404 while keeping the voltage V201. Since the voltage V201 is the low reference potential Vss at the time of rising the voltage V403, the voltage V404 keeps the low reference potential Vss. The operating circuit 416 stops because the voltage V404 is the low reference potential Vss. Thereby, during the power supply starting period, unstable operation of the operating circuit 416 can be prevented. Besides, since the signal wiring 201 can be disposed at the upper portion of the gate 103 of the MOS capacitor, the area of a semiconductor device can be effectively utilized.

According to the present embodiment, the p-channel MOS capacitor 813 is used as a bypass condenser in a circuit in which the low reference potential Vss is supplied to the signal wiring 201 at the time of starting the power supply. In the p-channel MOS capacitor 813, the gate is connected to the low reference potential Vss, and the source and the drain are connected to the high reference potential Vdd. In the signal wiring 201, since the gate 103 connected via the parasitic capacitor 202 is connected to a terminal of the low reference potential Vss when the low reference potential Vss is supplied at the time of starting the power supply, the low reference potential Vss is stably set, and erroneous operation at the time of starting the power supply can be prevented. Besides, since the signal wiring 201 can be disposed close to the gate 103, a region in the semiconductor device can be effectively used. In addition, the MOS capacitor 813 can be functioned as a bypass condenser.

Second Embodiment

FIG. 9 is a circuit diagram showing another example of a semiconductor device using the bypass MOS condenser 813 and the signal wiring 201. Points in which the circuit in FIG. 9 differs from the circuit in FIG. 4 will be explained. Though the operating circuit 416 operates when the voltage V404 is in a high level in the circuit in FIG. 4, the operating circuit 416 in FIG. 9 operates when the voltage V404 is in a low level.

Figure 10:
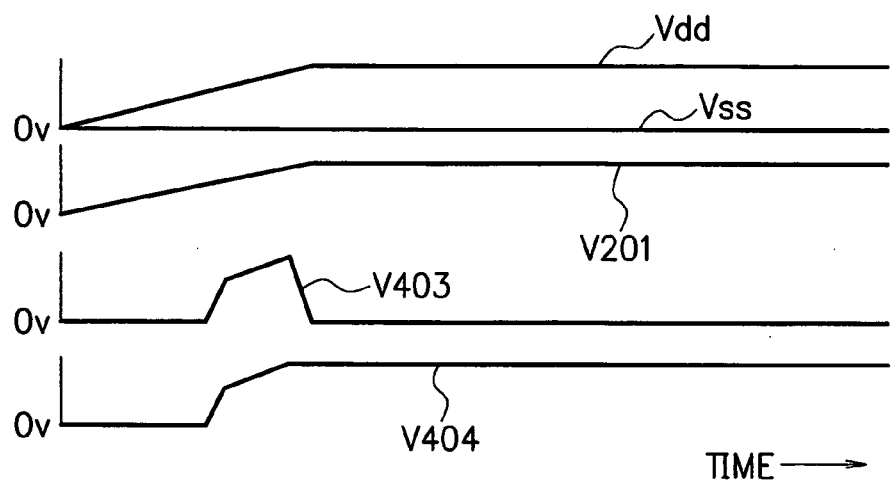
FIG. 10 is a timing chart showing an example of operation of an ideal semiconductor device at the time of starting the power supply when no parasitic capacitor 202 in FIG. 9 is in existence.

FIG. 10 is a timing chart showing an example of operation of an ideal semiconductor device at the time of starting the power supply when no parasitic capacitor 202 in FIG. 9 is in existence. The explanation of the high reference potential Vdd and the low reference potential Vss are the same as the above explanation for FIG. 5. The command circuit 411 outputs the low reference potential Vss to the wiring 401 at the time of starting the power supply. The driver 412 logically inverses the output signal and outputs the high reference potential Vdd to the wiring 201. The voltage V201 of the wiring 201 time-varies as the same voltage as the high reference potential Vdd. The voltage V403 is the same as the above-described explanation for FIG. 5. The flip-flop 415 synchronizes with rising of the voltage V403 and outputs the voltage V404 to the wiring 404 while keeping the voltage V201. Since the voltage V201 is the high reference potential Vdd at the time of rising of the voltage V403, the voltage V404 becomes the high reference potential Vdd. Since the voltage V404 is the high reference potential Vdd, the operating circuit 416 stops operation, thereby preventing unstable operation of the operating circuit 416 during the power supply starting period.

Figure 11:
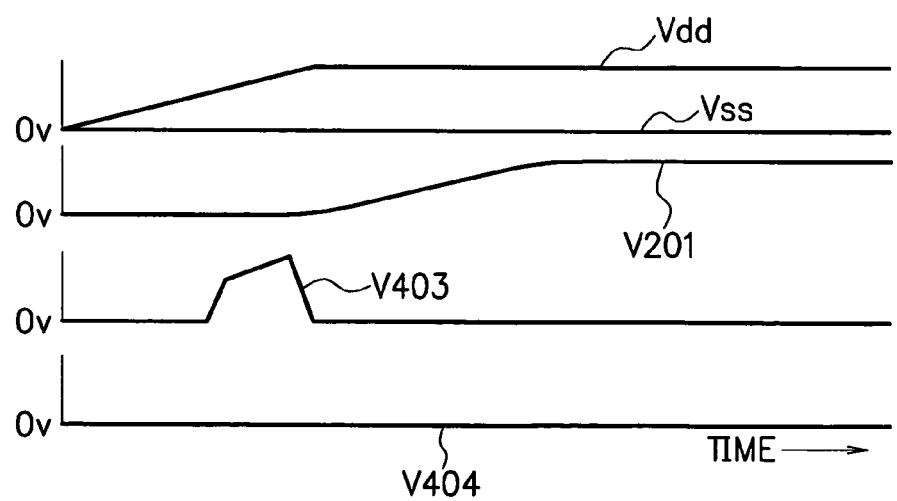
FIG. 11 is a timing chart showing an example of operation of a semiconductor device at the time of starting the power supply when the parasitic capacitor 202 in FIG. 9 is in existence.

FIG. 11 is a timing chart showing an example of operation of a semiconductor device at the time of starting the power supply when the parasitic capacitor 202 in FIG. 9 is in existence. The explanation of the high reference potential Vdd and the low reference potential Vss are the same as the above explanation for FIG. 10. Since the high reference potential Vdd does not reach a fixed potential at the time of starting the power supply, output capacity of the driver 412 is insufficient. Since the signal wiring 201 is connected to the low reference potential Vss via the parasitic capacitor 202, the voltage V201 keeps the low reference potential Vss for a while. When the high reference potential Vdd becomes sufficiently high, the output capacity of the driver 412 becomes sufficient, so that the voltage V201 gradually rises and then becomes the high reference potential Vdd. The explanation of the voltage V403 is the same as the above-described explanation for FIG. 10. Since the voltage V201 is in a low level at the time of rising of the voltage V403, the voltage V404 keeps the low reference potential Vdd. Since the voltage V404 is the low reference potential Vss, there arises a problem that the operating circuit 416 erroneously operates even at the time of starting the power supply.

Figure 12:
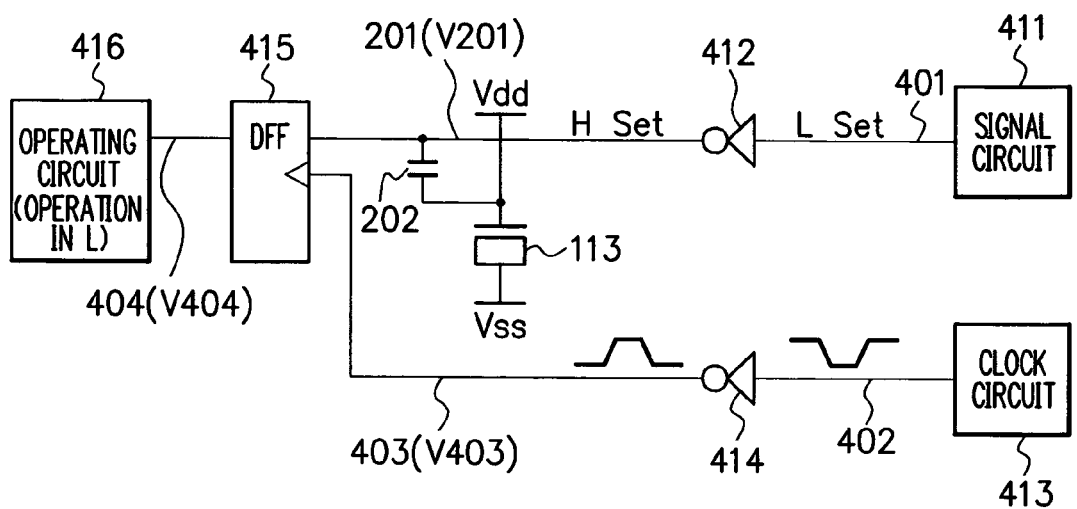
FIG. 12 is a circuit diagram showing an example of a semiconductor device using a bypass MOS condenser and signal wiring according to a second embodiment of the present invention.

FIG. 12 is a circuit diagram showing an example of the semiconductor device using the bypass MOS condenser 113 and the signal wiring 201 according to the second embodiment of the present invention. The circuit in FIG. 12 differs from the circuit in FIG. 9 in that the n-channel MOS capacitor 113 is provided instead of the n-channel MOS capacitor 813. In the n-channel MOS capacitor 113, the gate is connected to the high reference potential Vdd, and the source and the drain are connected to the low reference potential Vss. The signal wiring 201 is connected to the gate of the MOS capacitor 113 via the parasitic capacitor 202. The configuration of the n-channel MOS capacitor 113 is the same as the configulation of FIGS. 2A to 2C.

Operation of a circuit in FIG. 12 will be explained referring to FIG. 10. The explanation of the high reference potential Vdd and the low reference potential Vss is the same as the above-described explanation. Since the signal wiring 201 is connected to the high reference potential Vdd via the parasitic capacitor 202, the voltage V201 of the signal wiring 201 rises in voltage following to the high reference potential Vdd, and then the high reference potential Vdd is kept. The explanation of the voltage V403 is the same as the above explanation. Since the voltage V201 is in a high level at the time of rising of the voltage V403, the voltage V404 becomes the high reference potential Vdd. Since the voltage V404 is the high reference potential Vdd, the operating circuit 416 stops operation so that erroneous operation at the time of starting the power supply can be prevented. Moreover, since the signal wiring 201 can be disposed at the upper portion of the gate 103 of the MOS capacitor 113, the area of a semiconductor device can be effectively used.

According to the present embodiment, in a circuit in which the high reference potential Vdd is supplied to the signal wiring 201 at the time of starting the power supply, the n-channel MOS capacitor 113 is used as a bypass condenser. In the n-channel MOS capacitor 113, the gate is connected to the high reference potential Vdd, and the source and the dain are connected to the low reference potential Vss. In the signal wiring 201, when the high reference potential Vdd is supplied at the time of starting the power supply, since the gate 103 connected via the parasitic capacitor 202 is connected to a terminal of the high reference potential Vdd, the high reference potential Vdd is stably set, so that erroneous operation at the time of starting the power supply can be prevented. Furthermore, since the signal wiring 201 can be disposed closely to the gate 103, region in a semiconductor device can be effectively used. Besides, the MOS capacitor 113 can be served as a bypass condenser.

It should be noted that the circuit in the first embodiment shown in FIG. 7 and the circuit in the second embodiment shown in FIG. 12 can be provided in the same semiconductor device.

The first signal wiring is connected to the gate via the parasitic capacitor. The gate is connected to a low reference potential terminal. Thereby, when a signal in low reference potential is supplied to the first signal wiring, the low reference potential is stably set in the first signal wiring, so that erroneous operation at the time of starting the power supply can be prevented. Furthermore, since the first signal wiring can be disposed closely to the gate, regions in a semiconductor device can be effectively utilized. Further, the first MOS capacitor can serve as a bypass condenser.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
   a high reference potential terminal and a low reference potential terminal composing power supply voltage terminals;
   a first MOS capacitor in which a gate of a p-channel MOS field effect transistor is connected to said low reference potential terminal, and a source and a drain are directly connected to said high reference potential terminal; and
   a first signal wiring connected to the gate of the p-channel MOS field effect transistor via a parasitic capacitor and a signal in the low reference potential is supplied to the first signal wiring at the time of starting the power supply.

2. The semiconductor device according to claim 1, wherein said first signal wiring is connected to the gate via an insulating film at an upper portion of the gate.

3. The semiconductor device according to claim 1, further comprising:
   a first operating circuit being capable of operation by receiving the high reference potential to said first signal wiring.

4. The semiconductor device according to claim 3, further comprising;
   a first flip-flop synchronizing with a first clock signal, keeping a signaling state of said first signal wiring and outputting the signaling state to said first operating circuit, and
   wherein said first operating circuit becomes capable of operation when said high reference potential is supplied from said first flip-flop.

5. The semiconductor device according to claim 4, further comprising:
   a first signal circuit to supply a signal in the low reference potential to said first signal wiring at the time of starting the power supply.

6. The semiconductor device according to claim 5, further comprising:
   a first clock circuit to supply the first clock signal to said first flip-flop.

7. The semiconductor device according to claim 1, wherein said gate connected via the parasitic capacitor is connected to said low reference potential terminal when the low reference potential is supplied at the time of starting the power supply and thereby said first signal wiring is stably set at the low reference potential.

8. A semiconductor device, comprising:
   a high reference potential terminal and a low reference potential terminal composing power supply voltage terminals;
   a first MOS capacitor in which a gate of an n-channel MOS field effect transistor is directly connected to said high reference potential terminal, and a source and a drain are connected to said low reference potential terminal; and
   a first signal wiring connected to the gate of the n-channel MOS field effect transistor via a parasitic capacitor and a signal in the high reference potential is supplied to the first signal wiring at the time of starting the power supply.

9. The semiconductor device according to claim 8, wherein said first signal wiring is connected to the gate via an insulating film at an upper portion of the gate.

10. The semiconductor device according to claim 8, further comprising:
    a first operating circuit being capable of operation by receiving the low reference potential to said first signal wiring.

11. The semiconductor device according to claim 10, further comprising;
    a first flip-flop synchronizing with a first clock signal, keeping a signaling state of said first signal wiring and outputting the signaling state to said first operating circuit, and
    wherein said first operating circuit becomes capable of operation when the low reference potential is supplied from said first flip-flop.

12. The semiconductor device according to claim 11, further comprising:
    a first signal circuit to supply a signal in the high reference potential to said first signal wiring at the time of starting the power supply.

13. The semiconductor device according to claim 12, further comprising:
    a first clock circuit to supply the first clock signal to said first flip-flop.

14. The semiconductor device according to claim 8, wherein said gate connected via the parasitic capacitor is connected to said high reference potential terminal when the high reference potential is supplied at the time of starting the power supply, and thereby said first signal wiring is stably set at the high reference potential.

15. A layout method for a semiconductor device comprising:
    laying out a high reference potential terminal and a low reference potential terminal composing power supply voltage terminals;
    laying out a first MOS capacitor in which a p-channel MOS field effect transistor gate is connected to said low reference potential terminal, and a source and a drain are directly connected to said high reference potential terminal; and
    laying out a first signal wiring, connected to the gate of the p-channel MOS field effect transistor via a parasite capacitor, and a signal in the low reference potential is supplied to the first signal wiring at the time of starting the power supply.

16. A layout method for a semiconductor device comprising:
- laying out a high reference potential terminal and a low reference potential terminal composing power supply voltage terminals;
- laying out a first MOS capacitor in which an n-channel MOS field effect transistor gate is directly connected to said high reference potential terminal, and a source and a drain are connected to said low reference potential terminal; and
- laying out a first signal wiring, connected to the gate of the n-channel MOS field effect transistor via a parasite capacitor, and a signal in the high reference potential is supplied to the first signal wiring at the time of starting the power supply.

17. A semiconductor device, comprising:
- a high reference potential terminal and a low reference potential terminal composing power supply voltage terminals;
- a first MOS capacitor in which a gate of a p-channel MOS field effect transistor is connected to said low reference potential terminal, and a source and a drain are connected to said high reference potential terminal;
- a first signal wiring connected to the gate of the p-channel MOS field effect transistor via a parasitic capacitor and a signal in the low reference potential is supplied to the first signal wiring at the time of starting the power supply;
- a first operating circuit being capable of operation by receiving the high reference potential to said first signal wiring; and
- a first flip-flop synchronizing with a first clock signal, keeping a signaling state of said first signal wiring and outputting the signaling state to said first operating circuit,
- wherein said first operating circuit becomes capable of operation when said high reference potential is supplied from said first flip-flop.

18. A semiconductor device, comprising:
- a high reference potential terminal and a low reference potential terminal composing power supply voltage terminals;
- a first MOS capacitor in which a gate of an n-channel MOS field effect transistor is connected to said high reference potential terminal, and a source and a drain are connected to said low reference potential terminal;
- a first signal wiring connected to the gate of the n-channel MOS field effect transistor via a parasitic capacitor and a signal in the high reference potential is supplied to the first signal wiring at the time of starting the power supply;
- a first operating circuit being capable of operation by receiving the low reference potential to said first signal wiring; and
- a first flip-flop synchronizing with a first clock signal, keeping a signaling state of said first signal wiring and outputting the signaling state to said first operating circuit,
- wherein said first operating circuit become capable of operation when the low reference potential is supplied from said first flip-flop.

* * * * *